United States Patent
Miyata

(10) Patent No.: US 10,230,209 B2
(45) Date of Patent: Mar. 12, 2019

(54) LASER CONTROL DEVICE, METHOD AND PROGRAM

(71) Applicant: FANUC CORPORATION, Yamanashi (JP)

(72) Inventor: Ryusuke Miyata, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 15/652,318

(22) Filed: Jul. 18, 2017

(65) Prior Publication Data

US 2018/0034232 A1  Feb. 1, 2018

(30) Foreign Application Priority Data

Jul. 26, 2016 (JP) ................ 2016-146481

(51) Int. Cl.
*H01S 3/13* (2006.01)
*H01S 5/068* (2006.01)
*H01S 5/0683* (2006.01)

(52) U.S. Cl.
CPC ........ *H01S 3/1305* (2013.01); *H01S 5/06825* (2013.01); *H01S 5/0683* (2013.01)

(58) Field of Classification Search
CPC .......................... H01S 3/1305; H01S 3/1306
See application file for complete search history.

(56) References Cited

U.S. PATENT DOCUMENTS

| 5,303,248 A | 4/1994 | Gibbs |
| 6,052,395 A | 4/2000 | Chiba |
| 7,020,171 B2 | 3/2006 | Koshimae et al. |
| 2003/0234240 A1* | 12/2003 | Yamazaki ............ B23K 26/702 219/121.62 |
| 2005/0201430 A1 | 9/2005 | Koshimae et al. |
| 2014/0195035 A1* | 7/2014 | Koshimae .......... B23K 37/0235 700/166 |

FOREIGN PATENT DOCUMENTS

| JP | H04-333297 A | 11/1992 |
| JP | 08-316558 A | 11/1996 |
| JP | H10-263859 A | 10/1998 |
| JP | 2003-224316 A | 8/2003 |
| JP | 2003-347667 A | 12/2003 |
| JP | 2004-251856 A | 9/2004 |

(Continued)

*Primary Examiner* — Xinning(Tom) Niu
*Assistant Examiner* — Sean P Hagan
(74) *Attorney, Agent, or Firm* — Studebaker & Brackett PC

(57) ABSTRACT

A laser control device includes: an averaging circuit that applies a primary delay filter to an actual instantaneous value; a data processing unit that applies a primary delay filter to an actual average value H, thereby calculating an actual average value S; a reference value generation unit that generates an reference value; and an output reduction determination unit that determines output reduction. In a case in which pulse on time in the output command value exceeds a sum of the processing period and start-up time of a power supply, if the actual instantaneous value falls below the reference value, it is determined that an output is reduced; and in a case in which the pulse on time is equal to or less than the sum, if the actual average value S falls below the reference value, it is determined that an output is reduced.

7 Claims, 7 Drawing Sheets

(56) References Cited

FOREIGN PATENT DOCUMENTS

| | | |
|---|---|---|
| JP | 2005-037267 A | 2/2005 |
| JP | 2007-044739 A | 2/2007 |
| JP | 2008-066321 A | 3/2008 |
| WO | 2014/002583 A1 | 1/2014 |
| WO | 2015/125472 A1 | 8/2015 |

* cited by examiner

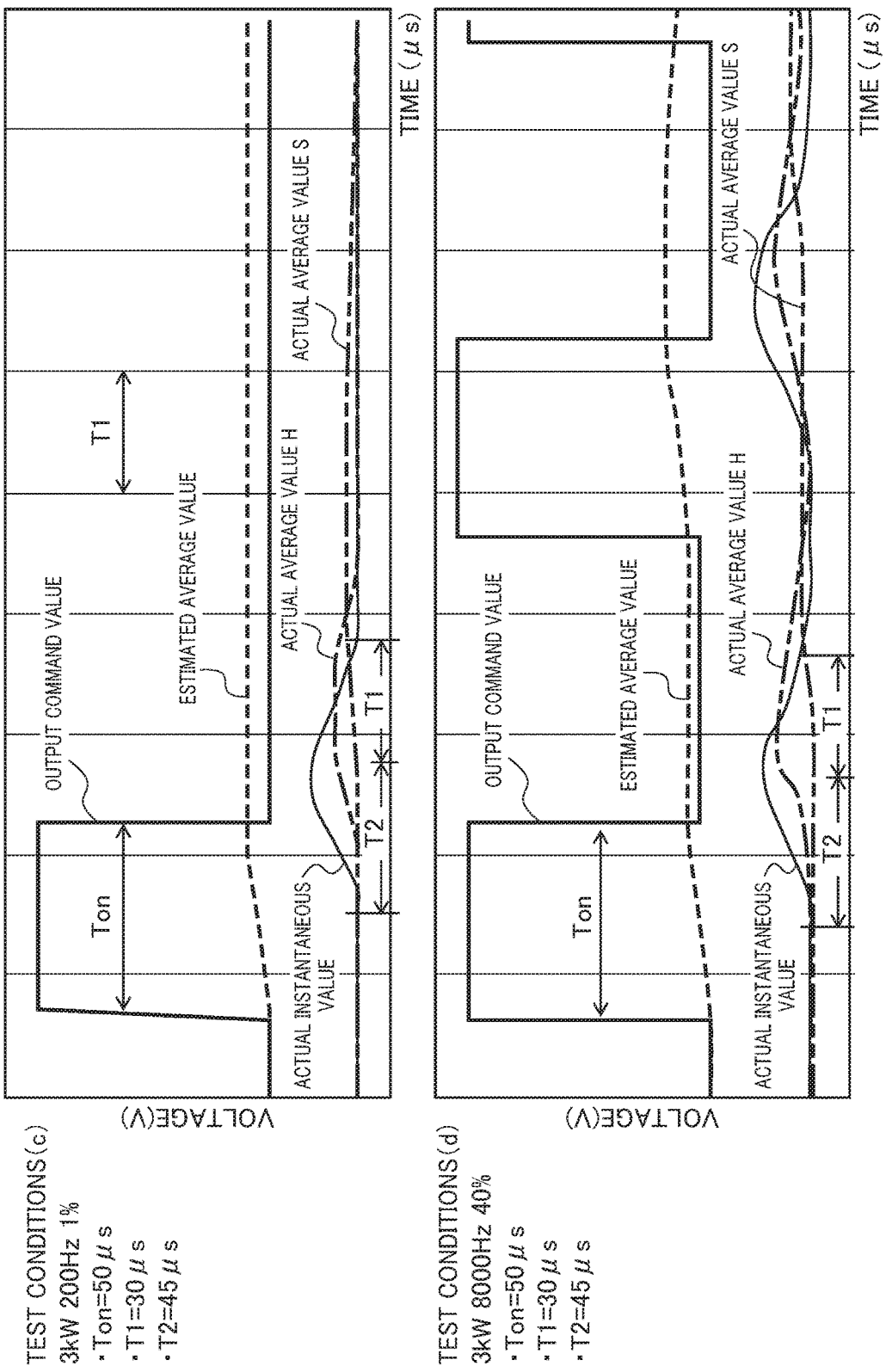

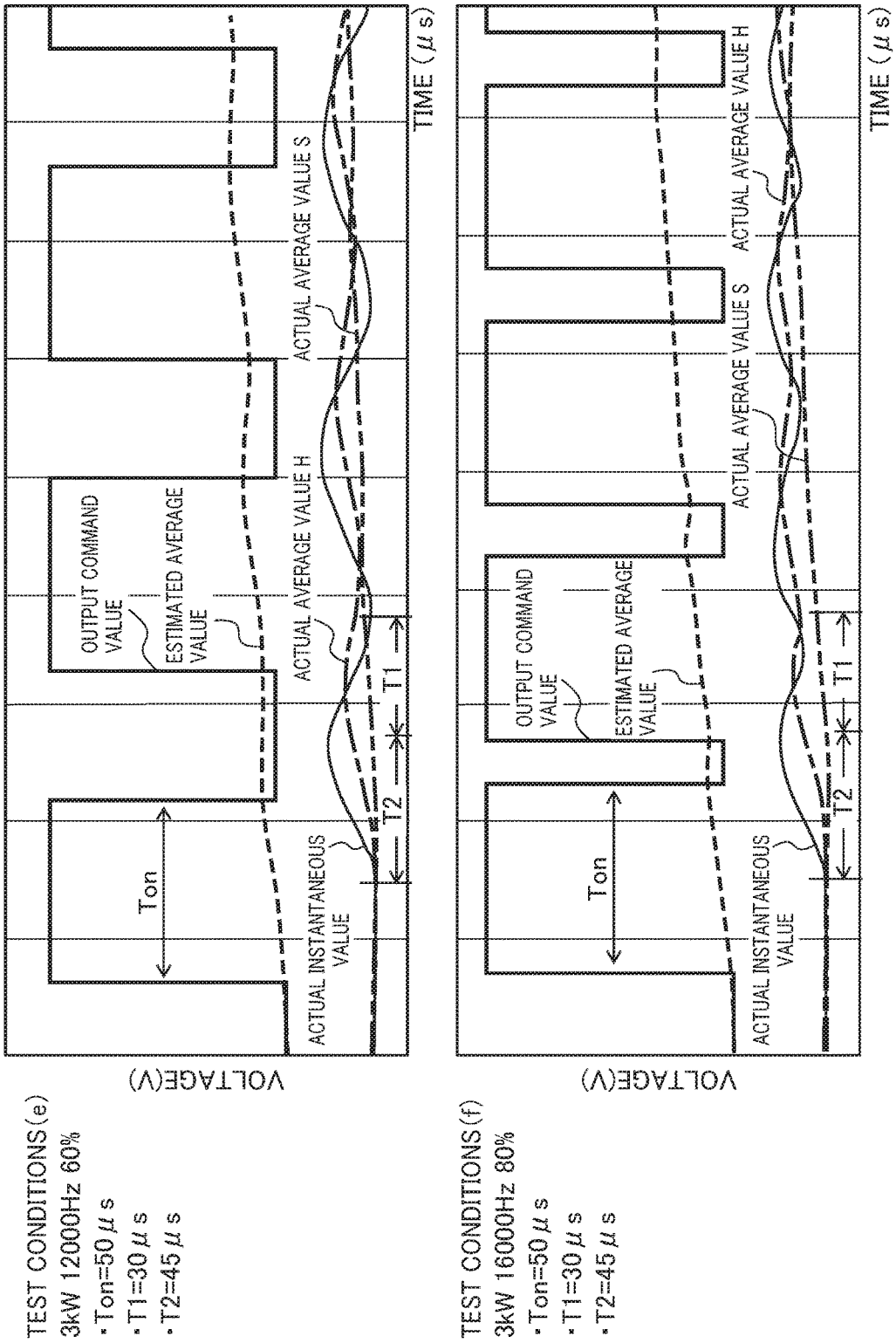

LASER CONTROL DEVICE, METHOD AND PROGRAM

This application is based on and claims the benefit of priority from Japanese Patent Application No. 2016-146481, filed on 26 Jul. 2016, the content of which is incorporated herein by reference.

BACKGROUND OF THE INVENTION

Field of the Invention

The present invention relates to a device, method and program for controlling a laser oscillator.

Related Art

Conventionally, when a failure occurs in a laser oscillator of a laser machine in a processable state, a protection technique to prevent such a failure part from expanding has been used. For example, since a laser output is reduced when a failure occurs in a laser oscillator, a technology has been proposed, in which such a phenomenon of output reduction is detected to stop the laser oscillation, thereby preventing the failure part of the oscillator from expanding (for example, refer to Patent Document 1).

However, if the laser oscillation is based on a voltage command in a pulse waveform, it is difficult to accurately calculate a laser output value; and if the pulse on time is shorter than a detection period, a laser output value cannot accurately be detected. Accordingly, there has been a proposal, in which a pulse output is calculated by way of a circuit calculating an integral value per one period of a pulse waveform (for example, refer to Patent Document 2).

Patent Document 1: Japanese Unexamined Patent Application, Publication No. 2003-224316

Patent Document 2: Japanese Unexamined Patent Application, Publication No. H08-316558

SUMMARY OF THE INVENTION

However, if the period of a pulse waveform is long, it takes a long time until output reduction by way of an integral value can be determined; therefore, the effect to prevent the failure part from expanding was not sufficient.

An object of the present invention is to provide a laser control device, method and program capable of stopping an output in a small amount of time, when a laser oscillator fails to operate properly.

(1) A laser control device (e.g., laser control device 20 to be described later) according to a first aspect of the present invention includes: an averaging circuit (e.g., averaging circuit 212 to be described later) that applies a primary delay filter to an actual instantaneous value of intensity of light that is output from a laser oscillator (e.g., laser oscillator 10 to be described later); a data processing unit (e.g., data processing unit 222 to be described later) that applies a primary delay filter to a first filter value calculated by way of the averaging circuit, for each predetermined processing period, thereby calculating a second filter value; a reference value generation unit (e.g., reference value generation unit 223 to be described later) that generates an output reduction reference value, based on an output command value for the laser oscillator; and an output reduction determination unit (e.g., output reduction determination unit 225 to be described later) that compares the actual instantaneous value or the second filter value with the output reduction reference value, thereby determining output reduction of the laser oscillator, in which, in a case in which pulse on time in the output command value exceeds a sum of the processing period and start-up time of a power supply of the laser oscillator, if the actual instantaneous value falls below the output reduction reference value, the output reduction determination unit determines that an output is reduced, and in a case in which the pulse on time is equal to or less than the sum, if the second filter value falls below the output reduction reference value, the output reduction determination unit determines that an output is reduced.

(2) In a second aspect of the laser control device according to the first aspect of the present invention, the data processing unit may apply a primary delay filter to a command waveform based on the output command value, for each processing period, thereby calculating an estimated average value, and in a case in which the pulse on time is equal to or less than the sum, the reference value generation unit may generate the output reduction reference value based on the estimated average value.

(3) In a third aspect of the laser control device according to the first aspect of the present invention, in a case in which the pulse on time exceeds the sum, the output reduction determination unit may determine output reduction during a period after the power supply starts up and before the output command value changes from peak to bottom.

(4) In a fourth aspect, the laser control device according to any one of the first to third aspects of the present invention further includes a storage unit (e.g., reference value storage unit 224 to be described later) that chronologically stores the output reduction reference value, in which the output reduction determination unit may use a value before a predetermined time frame stored in the storage unit, as the output reduction reference value.

(5) In a fifth aspect of the laser control device according to any one of the first to fourth aspects of the present invention, the start-up time may be a time since an output command for the power supply was executed until an electric current being output from the power supply reaches a predetermined percentage of a peak value.

(6) A laser control method according to a sixth aspect of the present invention causes a computer to execute: a data processing step of applying a primary delay filter to a first filter value that is obtained by way of an averaging circuit applying a primary delay filter to an actual instantaneous value of intensity of light that is output from a laser oscillator, for each predetermined processing period, thereby calculating a second filter value; a reference value generating step of generating an output reduction reference value, based on an output command value for the laser oscillator; and an output reduction determining step of comparing the actual instantaneous value or the second filter value with the output reduction reference value, thereby determining output reduction of the laser oscillator, in which, in the output reduction determining step, in a case in which pulse on time in the output command value exceeds a sum of the processing period and start-up time of a power supply of the laser oscillator, if the actual instantaneous value falls below the output reduction reference value, it is determined that an output is reduced, and in a case in which the pulse on time is equal to or less than the sum, if the second filter value falls below the output reduction reference value, it is determined that an output is reduced.

(7) A laser control program according to a seventh aspect of the present invention causes a computer to execute: a data processing step of applying a primary delay filter to a first filter value that is obtained by way of an averaging circuit applying a primary delay filter to an actual instantaneous value of intensity of light that is output from a laser oscillator, for each predetermined processing period, thereby calculating a second filter value; a reference value generating step of generating an output reduction reference value, based on an output command value for the laser oscillator; and an output reduction determining step of comparing the actual instantaneous value or the second filter value with the output reduction reference value, thereby determining output reduction of the laser oscillator, in which, in the output reduction determining step, in a case in which pulse on time in the output command value exceeds a sum of the processing period and start-up time of a power supply of the laser oscillator, if the actual instantaneous value falls below the output reduction reference value, the computer is caused to determine that an output is reduced, and in a case in which the pulse on time is equal to or less than the sum, if the second filter value falls below the output reduction reference value, the computer is caused to determine that an output is reduced.

The present invention can stop an output in a small amount of time, when a laser oscillator fails to operate properly.

BRIEF DESCRIPTION OF THE DRAWINGS

FIG. 6 is a first diagram illustrating an example of a test result that satisfies Condition 2 according to the embodiment; and FIG. 7 is a second diagram illustrating an example of a test result that satisfies Condition 2 according to the embodiment.

DETAILED DESCRIPTION OF THE INVENTION

Figure 1:
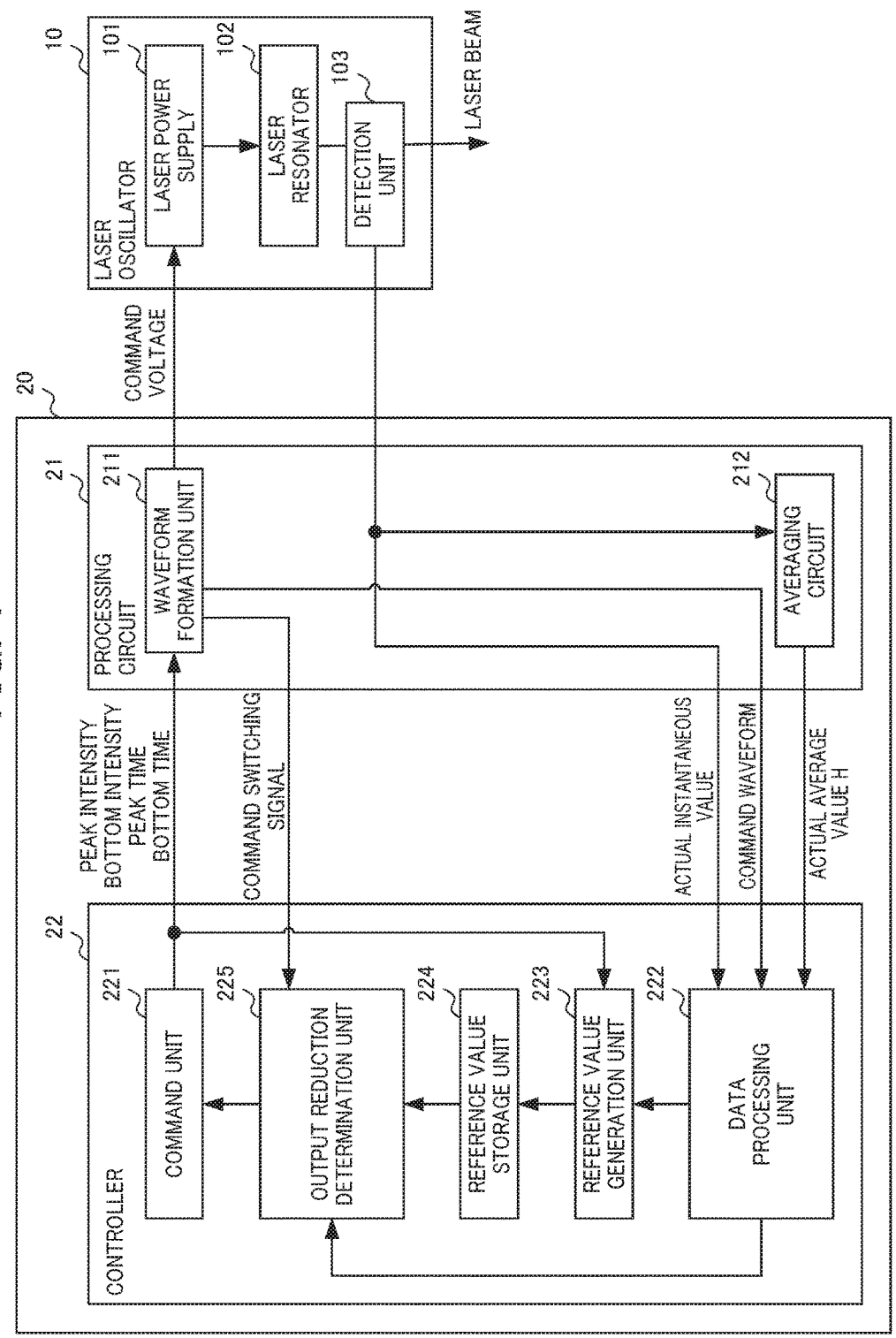
FIG. 1 is a diagram illustrating a functional configuration of a laser system according to an embodiment.

An example of an embodiment of the present invention is hereinafter described. FIG. 1 is a diagram illustrating a functional configuration of a laser system 1 including a laser control device 20 according to the present embodiment.

The laser system 1 includes a laser oscillator 10 and the laser control device 20 for controlling a laser oscillation operation of the laser oscillator 10. Further, the laser control device 20 includes a processing circuit 21 and a controller 22.

The laser oscillator 10 includes a laser power supply 101, a laser resonator 102, and a detection unit 103. The laser power supply 101 supplies electric power for laser oscillation, and outputs an electric current to the laser resonator 102, based on a command voltage from the laser control device 20. The laser resonator 102 outputs a laser beam of a predetermined frequency in accordance with an electric current supplied from the laser power supply 101. The detection unit 103 detects intensity of light that is output from the laser resonator 102, and provides the intensity as an actual instantaneous value to the laser control device 20.

The processing circuit 21 includes a waveform formation unit 211 and an averaging circuit 212. The waveform formation unit 211 forms a pulse waveform of a command voltage to be output to the laser oscillator 10, based on an output command value received from the controller 22. Further, the waveform formation unit 211 provides the pulse waveform formed and a command switching signal for pulse on/off (peak: 1; bottom: 0) to the controller 22.

The averaging circuit 212 is a circuit that applies a primary delay filter to an actual instantaneous value of intensity of light detected by way of the detection unit 103. As a result, actual instantaneous values during a predetermined period based on a set time constant are averaged, and an actual average value H (first filter value) is continuously output.

The controller 22 includes a command unit 221, a data processing unit 222, a reference value generation unit 223, a reference value storage unit 224, and an output reduction determination unit 225. The command unit 221 provides an output command to the laser resonator 102. Specifically, peak intensity, bottom intensity, peak time, and bottom time in a pulse oscillation operation are specified as output command values, and provided to the waveform formation unit 211 of the processing circuit 21.

The data processing unit 222 calculates an actual average value S (second filter value) by applying a primary delay filter to the actual average value H calculated by way of the averaging circuit 212 of the processing circuit 21, for each predetermined processing period T1 (sampling period). Further, the data processing unit 222 calculates an estimated average value by applying a primary delay filter to a command waveform formed by way of the waveform formation unit 211, for each processing period T1, in a way similar to the actual average value H.

The reference value generation unit 223 generates an output reduction reference value, based on the output command values (peak intensity, bottom intensity, peak time, and bottom time). Specifically, for example, a value obtained by multiplying the peak intensity by a predetermined percentage (for example, 90%) is set as a first reference value, a value obtained by multiplying the estimated average value calculated by way of the data processing unit 222 by a predetermined percentage (for example, 90%) is set as a second reference value, and any one of the reference values is used depending on the condition to be described later.

The reference value storage unit 224 chronologically and temporarily stores the output reduction reference value generated by way of the reference value generation unit 223, together with time information.

The output reduction determination unit 225 determines output reduction of the laser oscillator by comparing the actual instantaneous value or the actual average value S with the output reduction reference value, and stops the laser output by notifying the command unit 221. At this time, the output reduction determination unit 225 switches the comparison target data, in accordance with which either of the following two conditions is satisfied. Note that the output reduction determination unit 225 synchronizes the comparison target data (the actual instantaneous value or the actual average value S) by using a value before a predetermined time frame stored in the reference value storage unit 224, as an output reduction standard value.

(Condition 1) In the case in which the pulse on time Ton in the output command value exceeds the sum of processing period T1 and start-up time T2 of the laser power supply 101

(Ton>T1+T2), if the actual instantaneous value falls below the first reference value based on the peak intensity, the output reduction determination unit 225 determines that the output is reduced.

(Condition 2) In the case in which the pulse on time Ton in the output command value is equal to or less than the sum of the processing period T1 and the start-up time T2 of the laser power supply 101 (Ton≤T1+T2), if the actual average value S falls below the second reference value based on the estimated average value, the output reduction determination unit 225 determines that the output is reduced.

Here, the start-up time T2 is stored in advance as a time since the output command for the laser power supply 101 was executed until the electric current output from the laser power supply 101 reaches a predetermined percentage, for example, higher than 90% of the peak intensity, from the bottom intensity.

Figure 2:
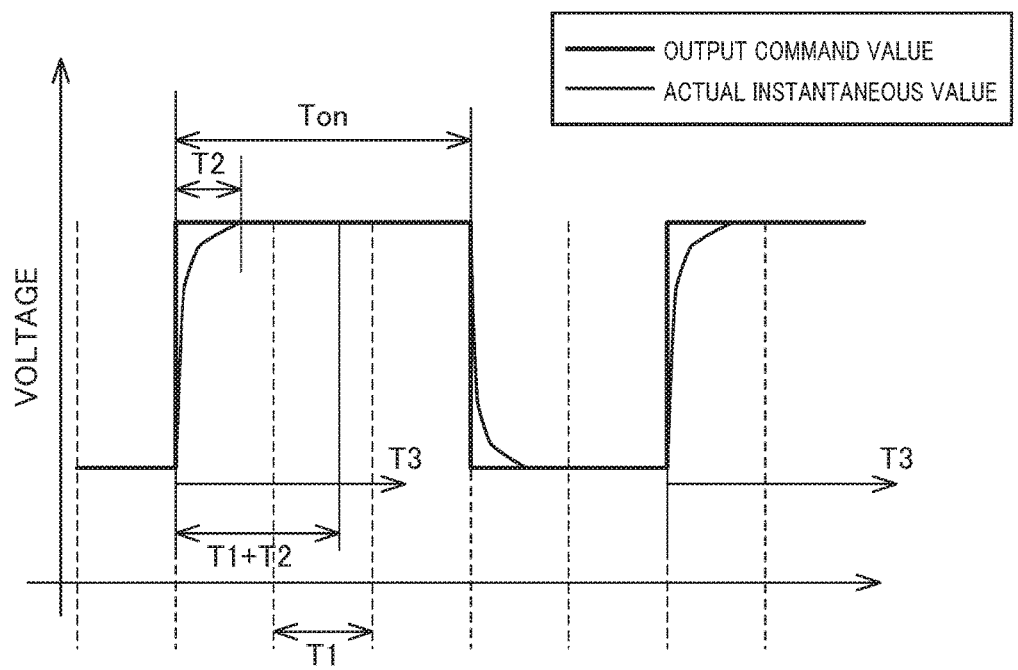
FIG. 2 is a diagram illustrating a technique of output reduction determination under Condition 1 according to the embodiment.

FIG. 2 is a diagram illustrating a technique of output reduction determination under Condition 1 according to the present embodiment. Under Condition 1 (pulse on time Ton>processing time T1+start-up time T2), the output reduction determination unit 225 counts the elapsed time T3 since the command switching signal changed from 0 (bottom) to 1 (peak), for each processing time T1. The output reduction determination unit 225 compares the sampling value of the actual instantaneous value for each processing time T1 with the output command value, during the period of T3≥start-up time T2, and if the actual instantaneous value<peak intensity×predetermined percentage (for example, 90%), the output reduction determination unit 225 determines that the output is reduced.

Note that, although comparison is performed based on voltage values in this example, laser intensity at an actual instantaneous value is mutually convertible with a voltage value in accordance with a predetermined conversion rule; therefore, comparison may be performed based on laser intensity.

Figure 3:
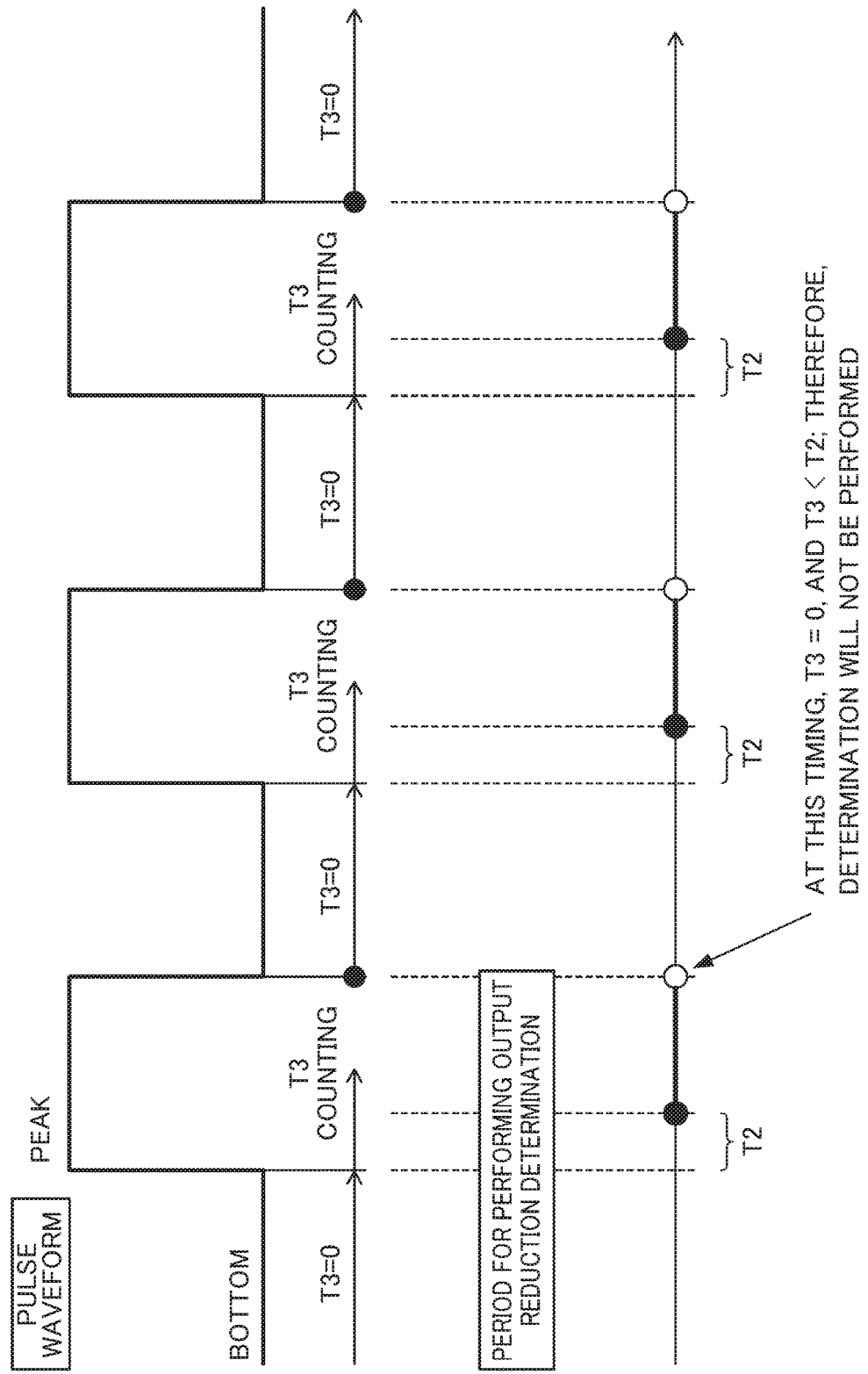
FIG. 3 is a diagram illustrating a period for performing output reduction determination according to the embodiment.

FIG. 3 is a diagram illustrating a period for performing output reduction determination under Condition 1 according to the present embodiment. Under Condition 1 (Ton>T1+T2), the output reduction determination unit 225 determines output reduction during a period after the power supply starts up and before the output command value changes from the peak to the bottom.

Specifically, the elapsed time T3 is only counted during the peak period from the moment the pulse waveform changed from the bottom to the peak. When the pulse waveform is bottom, the elapsed time T3 is defined as T3=0, and the period of T3≥T2 will be a period for performing output reduction determination. Note that T3=0, which is the timing when the pulse waveform changes from the peak to the bottom, is excluded from the period of T3≥T2; therefore, determination processing based on unstable values during command switching is suppressed.

Figure 4:
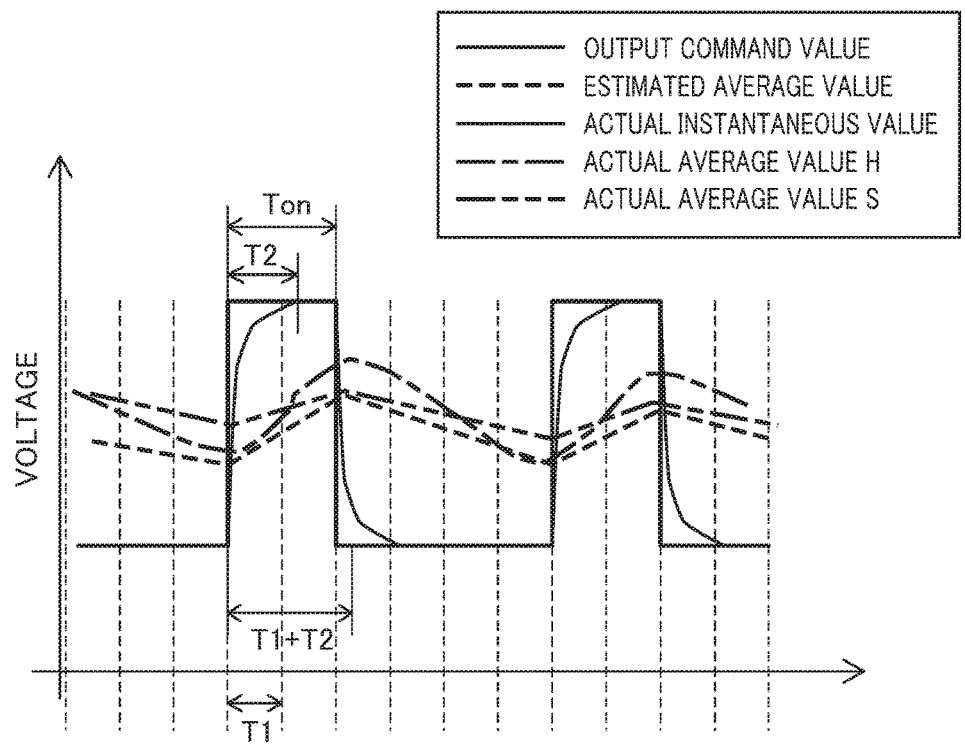
FIG. 4 is a diagram illustrating a technique of output reduction determination under Condition 2 according to the embodiment.

FIG. 4 is a diagram illustrating a technique of output reduction determination under Condition 2 according to the present embodiment. The data processing unit 222 calculates an actual average value S by averaging the actual average values H, and calculates an estimated average value by averaging the output command values, for one period of the output command. Under Condition 2 (pulse on time Ton≤processing time T1+start-up time T2), since the sampling cannot be performed at a peak value, the estimated average value is compared with the actual average value S, and if the actual average value S<estimated average value× predetermined percentage (for example, 90%), it is determined that the output is reduced.

Figure 5:
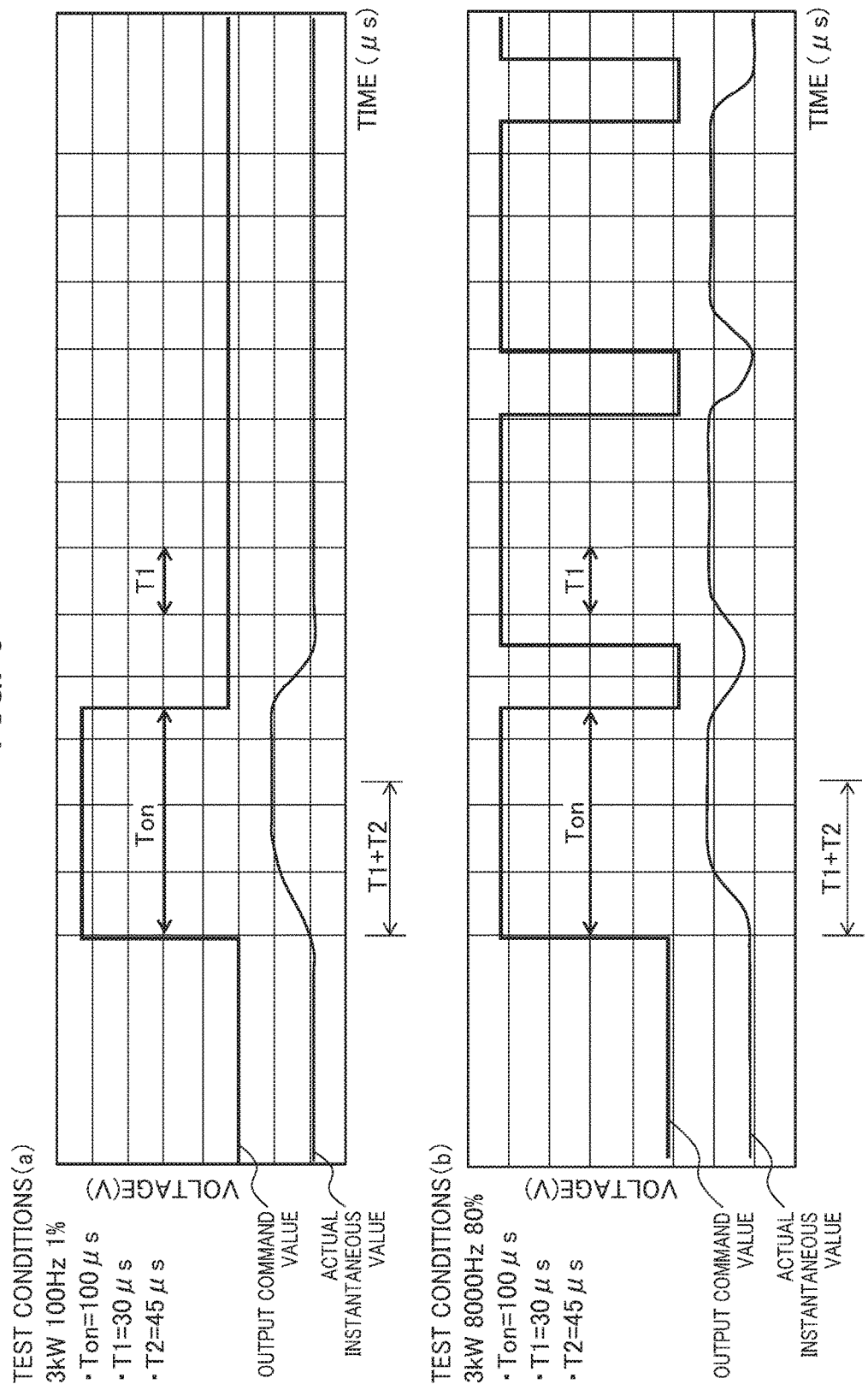
FIG. 5 is a diagram illustrating an example of a test result that satisfies Condition 1 according to the embodiment.

FIG. 5 is a diagram illustrating an example of a test result that satisfies Condition 1 according to the present embodiment. As test conditions, frequency and the rate of pulse on time are different between (a) "100 Hz, 1%" and (b) "8,000 Hz, 80%".

In both cases, Condition 1 of Ton (=100 μs)>T1 (=30 μs)+T2 (=45 μs) is satisfied, the sampling of peak intensity can be performed during a period of T3≥T1+T2, and output reduction is determined by comparing the actual instantaneous value with the output command value.

FIGS. 6 and 7 are diagrams illustrating examples of a test result that satisfies Condition 2 according to the present embodiment. As test conditions, frequency and the rate of pulse on time are different among (c) "200 Hz, 1%", (d) "8,000 Hz, 40%", (e) "12,000 Hz, 60%", and (f) "16,000 Hz, 80%".

In all the cases, Condition 2 of Ton (=50 μs)≤T1 (=30 μs)+T2 (=45 μs) is satisfied, and output reduction is determined by comparing the actual average value S with the estimated average value, during the entire period.

Note that, in all the cases, the actual instantaneous value delays from the output command value, which is due to the processing time from the output command to the actual laser output; and presence or absence of output reduction is determined after synchronization using the output reduction reference value buffered in the reference value storage unit 224.

According to the present embodiment, in accordance with a magnitude relationship between the pulse on time Ton and the sum of the processing time T1 and the start-up time T2, under Condition 1 which allows for sampling peak intensity, the laser control device 20 determines presence or absence of output reduction by comparing the actual instantaneous value with the output reduction reference value based on the peak intensity of the output command value. On the other hand, under Condition 2 which does not allow for sampling peak intensity, the laser control device 20 determines presence or absence of output reduction by comparing the actual average value S, which is obtained by processing the actual instantaneous values by way of the averaging circuit 212 and the data processing unit 222, with the output reduction reference value. Therefore, the laser control device 20 can detect output reduction in a small amount of time without depending on the waveform of the command voltage. As a result, when the laser oscillator fails to operate properly, the laser control device 20 can stop the laser output in a small amount of time, and prevent the failure part from expanding.

Note that the actual instantaneous values which are output from the detection unit 103 as illustrated in FIG. 1 are sampled during the processing period by way of the data processing unit 222. When the pulse on time is short, the detected width of a laser beam is also short; therefore, if the actual instantaneous value is directly data-processed, the sampling may not be allowed depending on the processing period of the data processing unit 222. Therefore, the laser control device 20 appropriately sets a sufficiently large time constant of the primary delay filter in the averaging circuit 212, whereby the actual average value H can more reliably be sampled, and output reduction can be determined with a high degree of accuracy by using the actual average value S.

Further, under Condition 2, the laser control device 20 uses the estimated average value, which is the output command value processed by way of the data processing unit 222, as an output reduction reference value; therefore, output reduction can be determined with a high degree of accuracy, by similarly average-processing the comparison targets.

Moreover, under Condition 1, the laser control device 20 determines output reduction during the period of peak intensity after the laser power supply 101 starts up. As a result, the laser control device 20 can determine output reduction by using a peak of the actual instantaneous values, with a high degree of accuracy.

Further, according to the laser control device 20, an output reduction reference value is temporarily stored, whereby the synchronization is based on a reference value that is old by the delay time, when the detected laser intensity is processed; therefore, output reduction can be determined with a high degree of accuracy.

Further, according to the laser control device 20, under Condition 1, output reduction determination is performed in a transient state approximating a predetermined percentage without waiting until the output current of the laser power supply 101 matches the command; therefore, determination can be performed in a smaller amount of time.

The embodiment of the present invention has been described above; however, the present invention is not limited to the embodiment described above. Moreover, the effects described in the present embodiment are merely enumeration of the preferable effects arising from the present invention; and the effects according to the present invention are not limited to those described in the present embodiment.

In the present embodiment, the control method by way of the laser control device 20 for the laser oscillator 10 that performs a pulse oscillation operation has been described; however, this control method can be applied to a continuous oscillation operation as well.

The control method by way of the laser control device 20 is implemented by software. When implemented by software, a program(s) composing the software is/are installed in a computer (controller 22). Further, such a program(s) may be recorded in a removable medium and distributed to a user, or may be downloaded via a network so as to be distributed to a computer of the user.

EXPLANATION OF REFERENCE NUMERALS

1 laser system
10 laser oscillator
20 laser control device
21 processing circuit
22 controller
101 laser power supply
102 laser resonator
103 detection unit
211 waveform formation unit
212 averaging circuit
221 command unit
222 data processing unit
223 reference value generation unit
224 reference value storage unit
225 output reduction determination unit

What is claimed is:

1. A laser control device, comprising:
a laser oscillator having a light output;
a detector positioned to detect the light output from the laser oscillator;
an averaging circuit that averages actual instantaneous values of intensity of light that is output from the laser oscillator during a predetermined period based on a set time constant, thereby calculating a first filter value;
a data processing unit that averages a plurality of first filter values to calculate an actual average value, for each predetermined processing period, thereby calculating a second filter value;
a reference value generation unit that generates an output reduction reference value, based on an output command value for the laser oscillator; and
an output reduction determination unit that compares the actual instantaneous value or the second filter value with the output reduction reference value, thereby determining output reduction of the laser oscillator, and upon determining that the output of the laser oscillator is reduced, stops the light output of the laser oscillator, wherein
in a case in which pulse on time in the output command value exceeds a sum of the processing period and start-up time of a power supply of the laser oscillator, if the actual instantaneous value falls below the output reduction reference value, the output reduction determination unit determines that an output is reduced, and
in a case in which the pulse on time is equal to or less than the sum, if the second filter value falls below the output reduction reference value, the output reduction determination unit determines that an output is reduced.

2. The laser control device according to claim 1, wherein the data processing unit calculates an estimated average value by averaging a plurality of output command values, for each processing period, and
in a case in which the pulse on time is equal to or less than the sum, the reference value generation unit generates the output reduction reference value based on the estimated average value.

3. The laser control device according to claim 1, wherein, in a case in which the pulse on time exceeds the sum, the output reduction determination unit determines output reduction during a period after the power supply starts up and before the output command value changes from peak to bottom.

4. The laser control device according to claim 1, further comprising a storage unit that chronologically stores the output reduction reference value, wherein
the output reduction determination unit uses a value before a predetermined time frame stored in the storage unit, as the output reduction reference value.

5. The laser control device according to claim 1, wherein the start-up time is a time since an output command for the power supply was executed until an electric current being output from the power supply reaches a predetermined percentage of a peak value.

6. A laser control method for causing a computer to execute:
a data processing step that averages a plurality of first filter values that are obtained by way of an averaging circuit that averages a plurality of actual instantaneous values of intensity of light that is output from a laser oscillator, for each predetermined processing period, thereby calculating a second filter value;
a reference value generating step of generating an output reduction reference value, based on an output command value for the laser oscillator; and
an output reduction determining step of comparing a one of the plurality of actual instantaneous values or the second filter value with the output reduction reference value, thereby determining output reduction of the laser oscillator, and upon determining that the output of the laser oscillator is reduced, stops the light output of the laser oscillator, wherein
in the output reduction determining step, in a case in which pulse on time in the output command value exceeds a sum of the processing period and start-up time of a power supply of the laser oscillator, if the actual instantaneous value falls below the output reduction reference value, it is determined that an output is reduced, and in a case in which the pulse on time is equal to or less than the sum, if the second filter value falls below the output reduction reference value, it is determined that an output is reduced.

7. A non-transitory computer-readable medium encoded with a laser control program for causing a computer to execute:

a data processing step that averages a plurality of first filter values that are obtained by way of an averaging circuit that averages a plurality of actual instantaneous values of intensity of light that is output from a laser oscillator, for each predetermined processing period, thereby calculating a second filter value;

a reference value generating step of generating an output reduction reference value, based on an output command value for the laser oscillator; and an output reduction determining step of comparing a one of the plurality of actual instantaneous values or the second filter value with the output reduction reference value, thereby determining output reduction of the laser oscillator, and upon determining that the output of the laser oscillator is reduced, stops the light output of the laser oscillator, wherein in the output reduction determining step, in a case in which pulse on time in the output command value exceeds a sum of the processing period and start-up time of a power supply of the laser oscillator, if the actual instantaneous value falls below the output reduction reference value, the computer is caused to determine that an output is reduced, and in a case in which the pulse on time is equal to or less than the sum, if the second filter value falls below the output reduction reference value, the computer is caused to determine that an output is reduced.

* * * * *